(12) United States Patent
Parsche

(10) Patent No.: US 8,872,711 B2
(45) Date of Patent: Oct. 28, 2014

(54) ELECTRONIC DEVICE INCLUDING A PATCH ANTENNA AND PHOTOVOLTAIC LAYER AND RELATED METHODS

(75) Inventor: Francis Eugene Parsche, Palm Bay, FL (US)

(73) Assignee: Harris Corporation, Melbourne, FL (US)

( * ) Notice: Subject to any disclaimer, the term of this patent is extended or adjusted under 35 U.S.C. 154(b) by 808 days.

(21) Appl. No.: 13/105,030

(22) Filed: May 11, 2011

(65) Prior Publication Data

US 2012/0287018 A1 Nov. 15, 2012

(51) Int. Cl.
- *H01Q 1/00* (2006.01)
- *H01Q 1/24* (2006.01)
- *H01L 31/0392* (2006.01)
- *H01L 31/042* (2014.01)
- *H01Q 1/38* (2006.01)
- *H01Q 9/04* (2006.01)

(52) U.S. Cl.
CPC .............. *H01Q 1/38* (2013.01); *H01Q 1/243* (2013.01); *H01L 31/0392* (2013.01); *H01L 31/042* (2013.01); *Y02E 10/50* (2013.01); *H01Q 9/0435* (2013.01)
USPC ................. 343/720; 343/700 MS; 343/872

(58) Field of Classification Search
USPC ................... 343/720, 700 MS, 872
See application file for complete search history.

(56) References Cited

U.S. PATENT DOCUMENTS

| | | | |
|---|---|---|---|
| 4,609,923 A | 9/1986 | Boan et al. | 343/897 |
| 4,812,854 A | 3/1989 | Boan et al. | 343/897 |
| 5,781,155 A * | 7/1998 | Woo et al. | 342/357.57 |
| 6,061,025 A | 5/2000 | Jackson et al. | 343/700 |
| 6,087,991 A * | 7/2000 | Kustas | 343/700 MS |
| 6,417,807 B1 | 7/2002 | Hsu et al. | 343/700 |
| 6,590,150 B1 * | 7/2003 | Kiefer | 136/258 |
| 6,697,020 B2 | 2/2004 | Ying | 343/702 |
| 6,774,847 B1 * | 8/2004 | Epstein et al. | 343/700 MS |
| 6,830,221 B1 | 12/2004 | Janson et al. | 244/158 |
| 7,129,493 B2 * | 10/2006 | Garner et al. | 250/347 |
| 7,246,439 B2 | 7/2007 | Rau et al. | 29/893.35 |
| 7,354,371 B2 | 4/2008 | Hazama et al. | 475/149 |
| 7,396,307 B2 | 7/2008 | Hazama et al. | 475/149 |
| 7,466,269 B2 | 12/2008 | Haziza | 343/700 |
| 7,644,989 B2 | 1/2010 | Baloche Faurecia | 297/362 |
| 7,766,634 B2 | 8/2010 | Liavas et al. | 418/170 |
| 7,847,735 B2 * | 12/2010 | Martin | 343/700 MS |
| 8,373,613 B2 * | 2/2013 | Lin et al. | 343/909 |
| 8,547,287 B2 * | 10/2013 | Leung et al. | 343/785 |
| 8,599,081 B2 * | 12/2013 | Leung et al. | 343/720 |

(Continued)

FOREIGN PATENT DOCUMENTS

| | | |
|---|---|---|
| EP | 0911906 | 4/1999 |
| EP | 1603188 | 12/2005 |

(Continued)

*Primary Examiner* — Paultep Savusdiphol
(74) *Attorney, Agent, or Firm* — Allen, Dyer, Doppelt, Milbrath & Gilchrist, P.A. Attorneys at Law

(57) ABSTRACT

An electronic device may include a substrate and a stacked arrangement of layers thereon. The stacked arrangement of layers may include a photovoltaic layer above the substrate, and an antenna ground plane above the photovoltaic layer. The antenna ground plane may include a first electrically conductive mesh layer being optically transmissive. The stacked arrangement of layers may further include a patch antenna above the photovoltaic layer and may include a second electrically conductive mesh layer being optically transmissive.

20 Claims, 11 Drawing Sheets

(56) References Cited

U.S. PATENT DOCUMENTS

| | | | |
|---|---|---|---|
| 2005/0001167 A1* | 1/2005 | Garmer et al. | 250/347 |
| 2008/0055177 A1* | 3/2008 | Dixon | 343/787 |
| 2009/0051598 A1 | 2/2009 | McCarrick et al. | 343/700 |
| 2010/0008052 A1* | 1/2010 | Martin | 361/748 |
| 2010/0103049 A1 | 4/2010 | Tabakovic | 343/700 |
| 2011/0030757 A1* | 2/2011 | Lin et al. | 136/244 |
| 2011/0122036 A1* | 5/2011 | Leung et al. | 343/785 |
| 2011/0260936 A1* | 10/2011 | Leung et al. | 343/720 |
| 2011/0260937 A1* | 10/2011 | Leung et al. | 343/720 |
| 2012/0032847 A1* | 2/2012 | Baktur | 342/365 |
| 2012/0211058 A1* | 8/2012 | Chen et al. | 136/251 |

FOREIGN PATENT DOCUMENTS

| | | |
|---|---|---|
| EP | 2169647 | 3/2010 |
| JP | 2001320224 | 11/2001 |
| JP | 2006303846 | 11/2006 |

* cited by examiner

ELECTRONIC DEVICE INCLUDING A PATCH ANTENNA AND PHOTOVOLTAIC LAYER AND RELATED METHODS

FIELD OF THE INVENTION

The present invention relates to the field of electronic devices, and, more particularly, to electronic devices including antennas and related methods.

BACKGROUND OF THE INVENTION

Antennas may be used for a variety of purposes, such as communications or navigation, and wireless devices may include broadcast receivers, pagers, or radio location devices ("ID tags"). The cellular telephone is an example of a wireless communications device, which is nearly ubiquitous. A relatively small size, increased efficiency, and a relatively broad radiation pattern are generally desired characteristics of an antenna for a portable radio or wireless device.

Additionally, as the functionality of a wireless device continues to increase, so too does the demand for a smaller wireless device which is easier and more convenient for a user to carry, yet uses relatively less power and/or has a longer standby time. One challenge this poses for wireless device manufacturers is designing antennas that provide desired operating characteristics within the relatively limited amount of space available for antennas, and that cooperate with related circuitry to use a reduced amount of power. For example, it may be desirable for an antenna to communicate at a given frequency with desired characteristics, such as bandwidth, polarization, gain pattern, and radiation pattern, for example, and for the wireless device to be operational for several days on a single battery or charge cycle.

It may be desirable that a personal communications device, for example, a cellular telephone, be relatively small in size. In other words, it may be desirable that the device volume and surface area are relatively limited. This, in turn, may result in size and performance trades between components, for example, having a relatively large battery may mean having a relatively small antenna. Compound designs may be desired to improve component integration.

The electrical power requirements of an electronic device, for example, have generally been reduced. For example, the field effect semiconductor has allowed even solar powered electronics to become increasingly popular. The solar cell may require increased product surface area however, which may be required for other purposes, for example, a keyboard.

Many antennas may include a combination of relatively good conductors and relatively good insulators for efficiency, for example. This may be particularly so in a microstrip patch antenna, for example, as strong near field reactive energies circulate in the printed wire board dielectric, which may cause heating losses. A solar cell which includes semiconductors, for example, are neither relatively good conductors nor relatively good insulators.

To achieve desired antenna characteristics, the size and shape of an antenna, for example, a patch antenna may be adjusted. For example, U.S. Patent Application Publication No. 2010/0103049 to Tabakovic discloses a patch antenna having a patch antenna element and a conductive layer and dual separated feeds coupled thereto. Each of the dual feeds has a conductor segment and a deltoid shaped conductive strip orthogonal to the conductor segment. U.S. Patent Application Publication No. 2009/0051598 to McCarrick et al. discloses a patch antenna having a solid geometry, for example, square, polygon, ellipse, oval, semicircle, and deltoid.

To reduce power consumption, the functionality of a photovoltaic cell may be combined with an antenna. For example, U.S. Pat. No. 6,590,150 to Kiefer attempts to combine the functionality of a photovoltaic cell and an antenna in a single unit. More particularly, Kiefer discloses a grid or front electrical contact, an anti-reflective coating, two semiconductor layers, a dielectric layer, and a ground plane layer configured in a stacked arrangement.

In an attempt to further provide space savings, several approaches disclose using a display and an antenna in a stacked relation. For example, U.S. Pat. No. 6,697,020 to Xing discloses an integrated multi-layer structure for a portable communications device that includes an antenna coupled between an LCD display and dielectric substrate. U.S. Pat. No. 6,774,847 to Epstein et al. discloses a chip antenna, a rigid printed circuit, a conductive material, a lens material, and a display coupled in a stacked arrangement.

SUMMARY OF THE INVENTION

In view of the foregoing background, it is therefore an object of the present invention to provide an electronic device that includes a patch antenna that provides desired operating characteristics and has a reduced size and cooperates with a photovoltaic layer.

This and other objects, features, and advantages in accordance with the present invention are provided by an electronic device that includes a substrate and a stacked arrangement of layers thereon. The stacked arrangement of layers includes a photovoltaic layer above the substrate, and an antenna ground plane above the photovoltaic layer. The antenna ground plane includes a first electrically conductive mesh layer being optically transmissive. The stacked arrangement of layers also includes a patch antenna above the photovoltaic layer and includes a second electrically conductive mesh layer being optically transmissive. Accordingly, the electronic device includes an optically transmissive patch antenna that cooperates with the photovoltaic layer and provides desired operating characteristics.

The electronic device may further include wireless circuitry powered by the photovoltaic layer and coupled to the patch antenna, for example. The electronic device may also include a dielectric layer between the antenna ground plane and the patch antenna. The dielectric layer may be optically transmissive, for example. The electronic device may further include at least one anti-reflective layer on the dielectric layer.

The patch antenna may have a perimeter defined by a plurality of perimeter segments comprising at least one pair of arcuate perimeter segments with a cusp therebetween. The at least one pair of arcuate perimeter segments may be inwardly extending, for example.

The patch antenna may be planar, for example. The electronic device may further include at least one antenna feed coupled to the patch antenna. The at least one antenna feed may include a pair of antenna feeds for a non-linear polarization, for example.

The second electrically conductive mesh layer may be a flexible interwoven electrically conductive mesh layer. The second electrically conductive mesh layer may include a body portion and a hem portion coupled thereto, for example.

A method aspect is directed to a method of making an electronic device. The method includes forming a stacked arrangement of layers on a substrate by at least. positioning a photovoltaic layer above the substrate, and positioning an antenna ground plane above the photovoltaic layer. The ground plane includes a first electrically conductive mesh layer that is optically transmissive. Forming the stacked arrangement of layers also includes positioning a patch antenna above the photovoltaic layer. The patch antenna includes a second electrically conductive mesh layer that is also optically transmissive.

DETAILED DESCRIPTION OF THE PREFERRED EMBODIMENTS

The present invention will now be described more fully hereinafter with reference to the accompanying drawings, in which preferred embodiments of the invention are shown. This invention may, however, be embodied in many different forms and should not be construed as limited to the embodiments set forth herein. Rather, these embodiments are provided so that this disclosure will be thorough and complete, and will fully convey the scope of the invention to those skilled in the art. Like numbers refer to like elements throughout, and prime and multiple notation is used to indicate similar elements in alternative embodiments.

Figure 1:
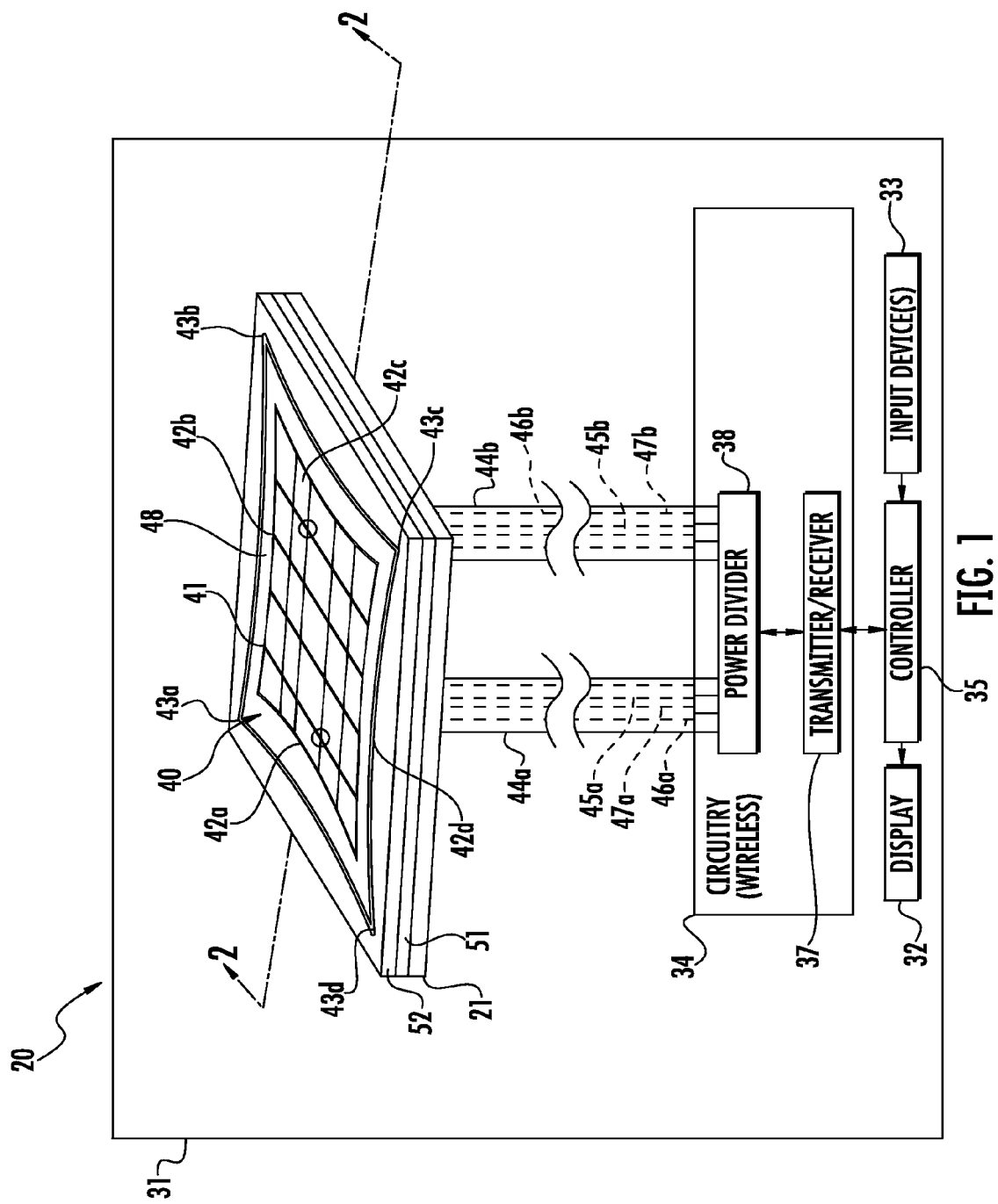
FIG. 1 is a perspective view of a portion of an electronic device in accordance with the present invention.
Figure 2:
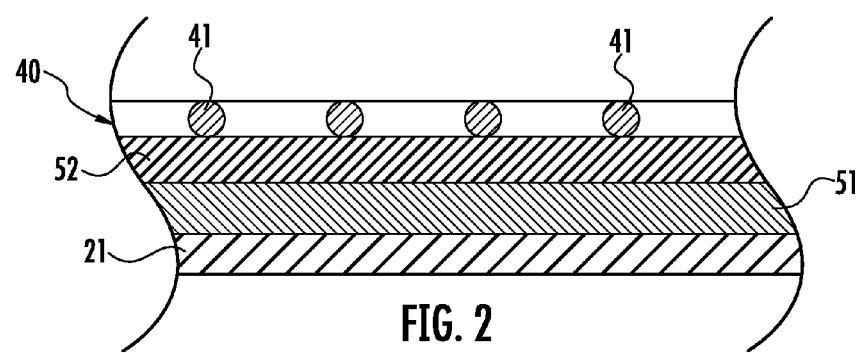
FIG. 2 is an enlarged cross-sectional view of a portion of the electronic device in FIG. 1 taken along the line 2-2.
Figure 3:
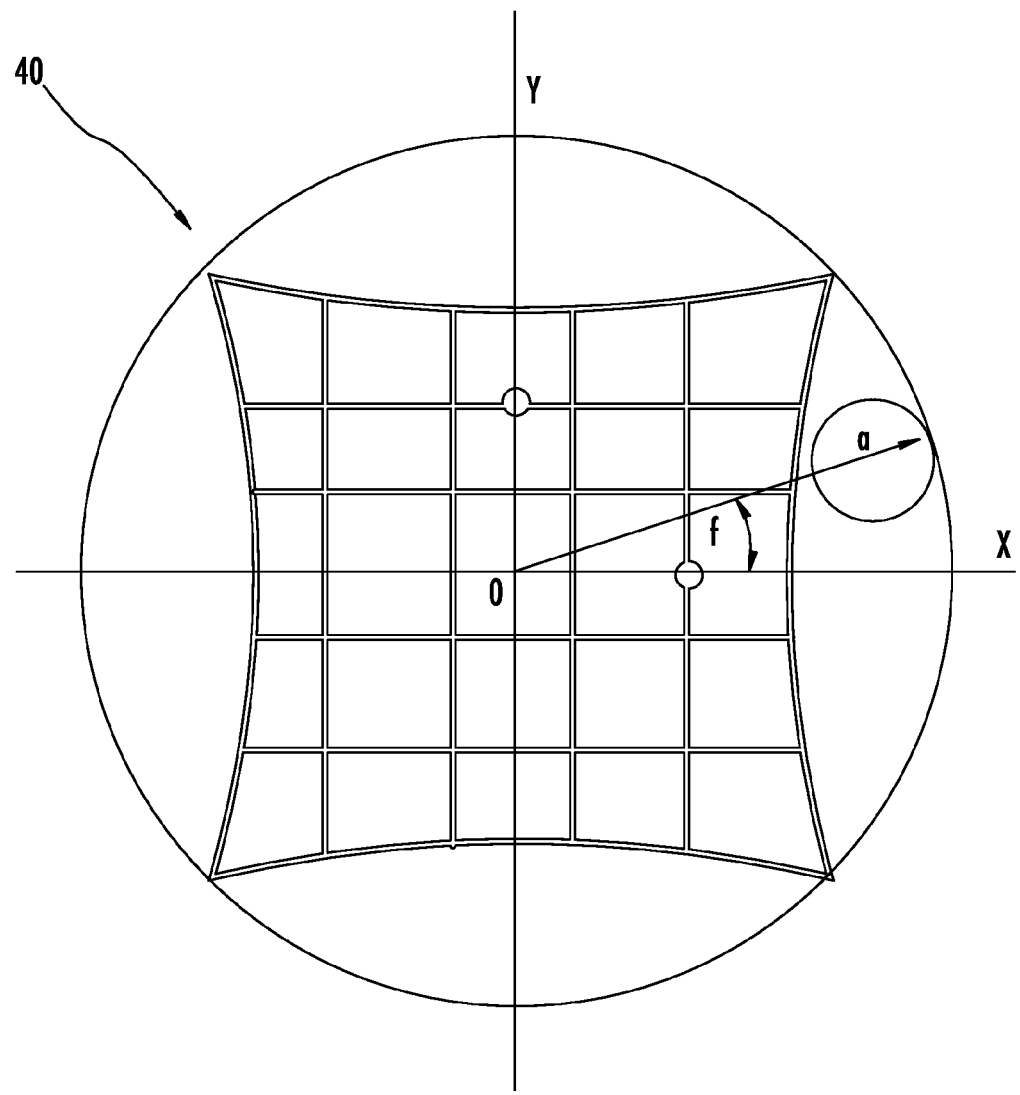
FIG. 3 is graph illustrating the relationship of between a circular shape antenna and the shape of the patch antenna of FIG. 1.

Referring initially to FIGS. 1-3, an electronic device 20 illustratively includes a housing 31. The electronic device also includes circuitry 34 carried by the housing 31. The electronic device 20 also includes input devices 33 and a display 32 carried by the housing 31. The circuitry 34 also includes a power divider 38 a receiver and/or transmitter 37 coupled thereto.

The circuitry 34 includes a controller 35 that is coupled to the display 32 and input devices 33, and is carried by the housing 31. Of course, the electronic device 20 may not include a display 32 and/or input devices 33, for example, if the circuitry is configured to perform at least one geo-location function or other function where these components may not be desired. The controller 35 may perform at least one wireless communications function. For example, the electronic device 20 may be a cellular telephone, and the controller 35 may cooperate with the receiver and/or transmitter 37 to communicate with a cellular base station. Of course, the electronic device 20 may be another type of device, for example, a two-way radio or a satellite receiver. The controller 35 may cooperate with the receiver and/or transmitter 37 to perform either or both of a receive and transmit function.

The electronic device 20 illustratively includes a substrate 21. The substrate may be a circuit board, such as, for example, a printed circuit board (PCB). In some embodiments, the substrate 21 may be the device housing 31.

The substrate 21 may be made of a material having permittivity and permeability within ±50% of each other to increase light transmission therethrough. It may be preferred that the substrate material may have a permittivity and a permeability within ±10% of each other. This may reduce loss of light transmission due to reflections, for example. Permittivity and permeability being within ±50% of each other in the substrate 21 may reduce the reflections to the air which can increase power production in a solar power embodiment, for example.

This may be shown mathematically. The reflection coefficient at the air to substrate interface is a function of the characteristic impedances of the air and substrate 21 according to:

$$\Gamma(\eta_{substrate\,21} - \eta_{air})(\eta_{substrate\,21} + \eta_{air}) \quad \text{(equation 1)}$$

Where:
$\Gamma$=the reflection coefficient, a dimensionless number between 0 and 1, preferentially 0 for the substrate 21,
$\eta_1$=the wave impedance in the substrate in ohms, and
$\eta_2$=the wave impedance in the air=377 ohms.
In turn the wave impedance in the air or substrate 21 may be calculated according to:

$$\eta = 120\pi\sqrt{(\mu_r/\epsilon_r)} \quad \text{(equation 2)}$$

where:
$\mu_r$=the relative magnetic permability of the air or substrate, and
$\epsilon_r$=the relative dielectric permeability of the air or substrate.
Zero reflection and increased light transmission occurs when $\mu_r = \epsilon_r$ in the substrate 21 since this condition causes $\eta_{substrate} = 120\pi = \eta_{air}$ in equation 2. As can be appreciated in equation 1 when $\eta_{substrate} = \eta_{air}$ the numerator is 0 which means equation 1 is 0, which thus means there is no reflection.

The electronic device 20 also includes a patch antenna 40 carried by the substrate 21. The patch antenna 40 includes an electrically conductive mesh layer 41 having a perimeter defining four arcuate perimeter segments 42a-42d. A respective cusp 43a-43d is between each of the four arcuate perimeter segments. Each of the four arcuate perimeter segments 42a-42d is illustratively extending inwardly. Of course, not all the perimeter segments 42a-42d may be arcuate, and not all the perimeter segments may extend inwardly. For example, a single pair of segments may be arcuate. Additionally, while four perimeter segments are illustrated, the patch antenna 40 may include two or more perimeter segments. Indeed, as will be appreciated by those skilled in the art, the shape of the electrically conductive mesh layer 41 may be described as resembling a hypocycloid. A hypocycloid shape may include a deltoid shape and an astroid, for example.

Inward or outward adjustment of the arcuate perimeter segments 42a-42d changes the frequency. In other words, the frequency is dependent on the overall size of the patch antenna 40. For broadside radiation, the perimeter may correspond to 360-degrees guided wavelength, which may also correspond to the forced resonance or 1 wavelength of the desired operating frequency, for example, in a dielectric printed wire board. An approximate formula for the circumference of an embodiment providing broadside radiation is:

$$C = c/(f\sqrt{\mu_r \epsilon_r})$$

Where:
C=circumference of the patch antenna 40
c=speed of light
f=operating frequency in Hertz
$\mu_r$=substrate relative magnetic permeability
$\in_r$=substrate relative dielectric permittivity An increase in the diameter a decreases the operating frequency which also reduces antenna size (FIG. 3). This is because current through the patch antenna 40 has a longer path to curl around the periphery for such a shape.

Advantageously, frequency may be adjusted without changing the envelope of the patch antenna 40, thus maintaining a smaller patch antenna. As will be appreciated by those skilled in the art, the shape of the patch antenna 40 assumes antenna properties of both linear (rectangular) and circular patch antennas. In other words, by adjusting the shape of the patch antenna 40, there is a continuous trade-off of divergence and curl, and antenna properties between patch antennas, such as, for example, size, frequency, and beam width. This relationship is illustrated more particularly in FIG. 3, wherein $x^{2/3}+y^{2/3}=a^{2/3}$, $x=a\cos^3 f$, and $y=a\sin^3 f$, which is the equation of the hypocycloid. The hypocycloid equation advantageously provides variation in the shape of the patch antenna 40 to form hybrids between the dipole turnstile (X shape) and loop (circle shape) patch antennas. For example, a concave arcuate patch embodiment has greater beamwidth than a convex arcuate embodiment and vice versa. The convex arcuate embodiment has more gain for area than a concave arcuate embodiment and vice versa.

The electrically conductive mesh layer 41 is also flexible. In other words, the electrically conductive mesh layer 41 may be contoured, for example, to the housing 31, substrate 21, or other structure, as will be appreciated by those skilled in the art. Additionally, the electronically conductive mesh layer 41 may also be interwoven.

The electrically conductive mesh layer 41 also includes a hem portion 48, which is coupled to a body portion. The hem portion 48, or solid border advantageously increases the overall strength of the patch antenna and flattens the Chebyshev response. More particularly, the hem portion 48 may make the Cheybshev response symmetrical about the polynomial zeroes.

The electrically conductive mesh layer 41 includes a metallic material, for example, molybdenum and gold. Further details of the electrically conductive mesh layer 41 may be found in U.S. Pat. Nos. 4,609,923 and 4,812,854, both to Boan et al., both of which are assigned to the assignee of the present application, and both of which are incorporated in their entirety by reference.

It may be particularly advantageous to reduce the diameter of the conductors forming the electrically conductive mesh layer 41 to increase transparency, for example. An example conductor width corresponds to the radio frequency skin depth which is given by:

$$W=\sqrt{(2\rho/\omega\mu)}$$

Where:
w=mesh conductor width
$\rho$=resistivity of mesh conductor
$\omega$=angular frequency=$2\pi f$
$\mu$=magnetic permeability of mesh conductor
As an example, for copper conductors at 1 GHz, a desired conductor width calculates to be $2.1\times10^{-6}$ meters. Thus, relatively fine width mesh conductors may be particularly advantageous for improved display visibility, for example.

The patch antenna 40 is illustratively planar. Indeed, while the patch antenna 40 being planar may be particularly advantageous for increased space savings in a limited space housing 31, for example, the patch antenna, in some embodiments (not shown), may not be planar.

The electronic device 20 also includes an antenna ground plane 51 between the substrate 21 and the patch antenna 40. The antenna ground plane 51 may be a conductive layer carried by the substrate 21 or PCB, and the antenna ground plane is preferentially optically transparent, for example, a relatively fine mesh. The substrate or PCB 21 may include the antenna ground plane 51 or it may be separate therefrom. A dielectric layer 52 is also between the antenna ground plane 51 and the patch antenna 40. An antenna ground plane material may be a conductive fabric, such as, for example, described in U.S. Pat. Nos. 4,609,923 and 4,812,854, both to Boan et al, as noted above. The substrate 21 may be coated with antireflection coatings (not shown) to increase light transmission through the dielectric layer 52, for example. Antireflective coatings may be used with other layers.

A pair of antenna feeds 44 is coupled to the patch antenna. The pair of antenna feeds 44 are also coupled to the circuitry 32, and more particularly, to the power divider 38. The power divider 38 is a zero-degree power divider, but may be another type of power divider. The pair of antenna feeds 44 is illustratively coaxial cable feeds. Each of the coaxial cable feeds 44a, 44b, has a respective inner and outer conductor 45, 46 separated by a dielectric layer 47. The inner conductor 45, or drive pin, of each of the coaxial cables 44a, 44b passes through the ground plane 51 and couples to the patch antenna 40. The outer conductors 46 are coupled to the ground plane 51.

Each coaxial cable feed 44a, 44b coupled between the electrically conductive mesh layer 41 and the power divider 38 may be a different length. The different lengths advantageously introduce a 90-degree alternating current (AC) phase different (i.e. a time delay) into the signal. Thus, the signal has a circular, or non-linear, polarization. In some embodiments, a single antenna feed may be used, and thus, the signal would have a linear polarization.

The first coaxial cable 44a is coupled to the electrically conductive mesh layer 41 at a first location, while the second coaxial cable 44b is coupled to the antenna at a second location that is diagonal from the first location with respect to the electrically conductive mesh layer 41. The position of the first and second locations determines impedance, which in the illustrated example, is about 50 ohms. The angular position of the antenna feeds 44a, 44b determines the polarization angle and orientation angle. More particularly, if a sine wave, for example, is applied to the first antenna feed 44a, because of the length difference of the coaxial cables, or antenna feeds, a cosine wave may be applied at the second location. This arrangement provides the circular polarization of a transmitted signal, for example. Indeed, while the antenna feeds 44a, 44b are illustratively coaxial cables, they may be other types of antenna feeds, such as, for example, electrically conductive tubes.

Figure 4:
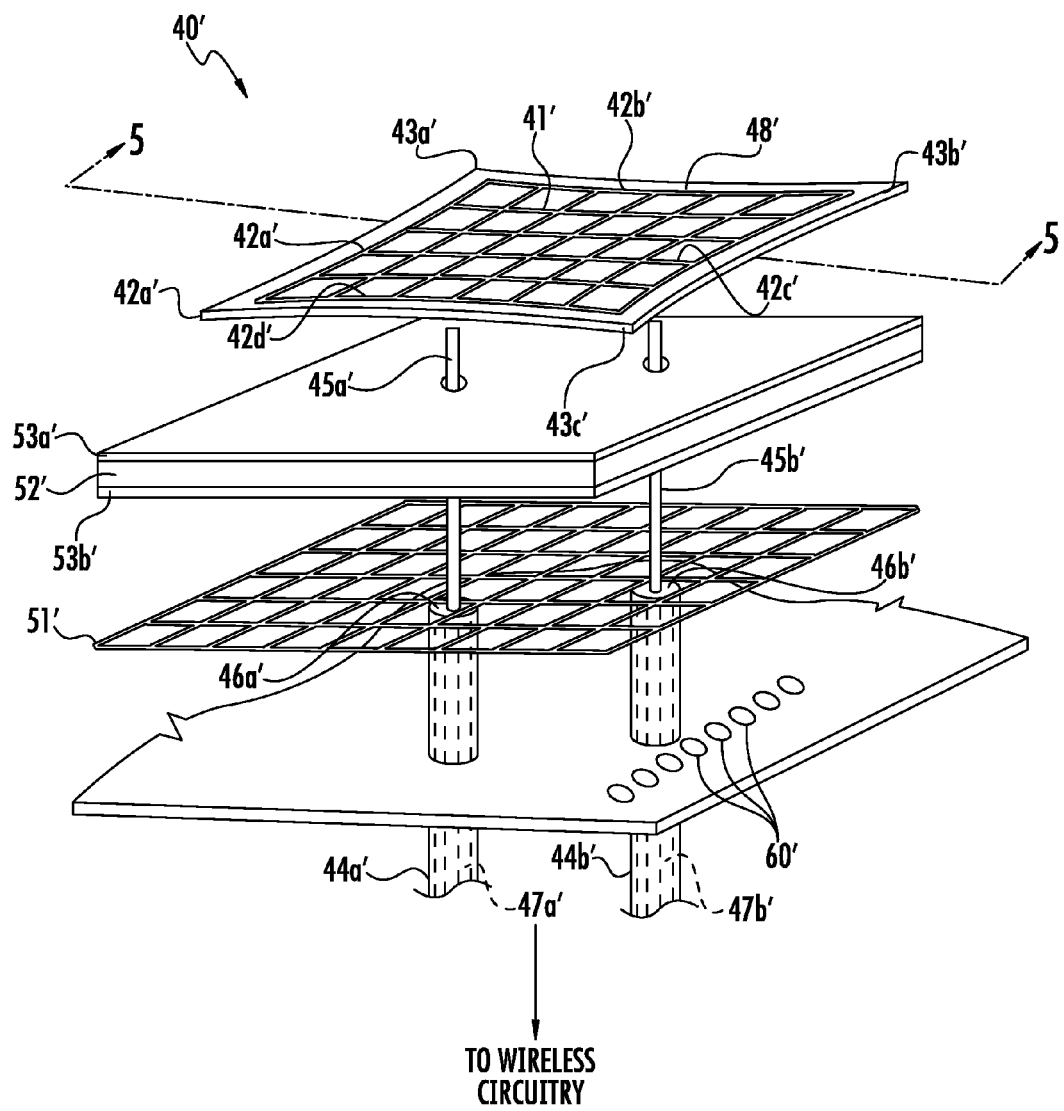
FIG. 4 is a perspective exploded view of a portion of another embodiment of an electronic device in accordance with the present invention.
Figure 5:
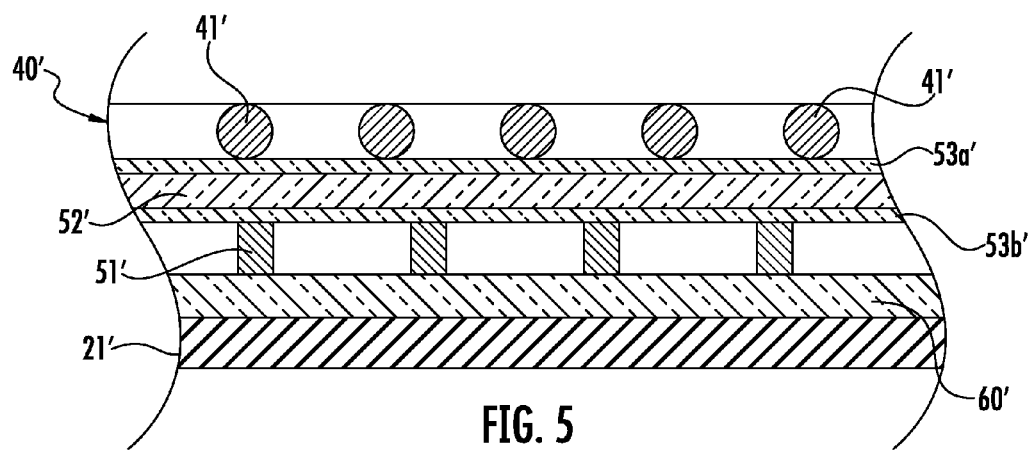
FIG. 5 is an enlarged cross-sectional view of a portion of the electronic device in FIG. 4 taken along the line 5-5.

Referring now to FIGS. 4-5, a particularly advantageous embodiment including a patch antenna 40' similar the patch antenna illustrated in FIG. 1, is illustrated in an electronic device 20'. The electronic device 20' includes a substrate 21' and a stacked arrangement of layers. A photovoltaic layer 60' is above the substrate 21'. The photovoltaic layer 60' is illustratively a layer of solar cells. The photovoltaic layer 60' may include other types of photovoltaic cells or devices, as will be appreciated by those skilled in the art.

The antenna ground plane 51' is illustratively above the photovoltaic layer 60' and between the substrate 21' and the patch antenna 40'. The antenna ground plane 51' is illustratively as a mesh so that it is optically transmissive. The antenna ground plane 51' may be copper, for example. The antenna ground plane 51' may be another type of conductive material, as will be appreciated by those skilled in the art. The antenna ground plane 51' is particularly advantageous because the solar cells of the photovoltaic layer 60' are typically a relatively poor ground plane.

The patch antenna 40' is illustratively above the photovoltaic layer 60' and the antenna ground plane 51'. The patch antenna 40' is illustratively a conductive mesh material or includes a conductive mesh layer 41' that is also optically transmissive. The optically transmissive patch antenna 40' and antenna ground plane 51' advantageously allow between about 51-52% of light through to the photovoltaic layer 60'.

The dielectric layer 52' between the antenna ground plane 51' and the patch antenna 40' is also light-transmissive. The dielectric layer 52' may be glass. However, glass may be susceptible to increased breakage and may be relatively fragile. The dielectric layer 52' may be polystyrene. The dielectric layer 52' may also be polycarbonate, which exhibits increased RF dissipation, as will be appreciated by those skilled in the art.

The dielectric layer 52' illustratively includes an anti-reflective layer 53a', 53b' on both sides thereof to reduce light reflection back away from the photovoltaic layer 60'. Of course, the anti-reflective layer 53' may be on one side of the dielectric layer 52' and may be on a portion or portions of the dielectric layer.

The anti-reflective layer 53' may be a quarter-wavelength thick with respect to the desired light. The anti-reflective layer 53' may include titanium and/or fluorine. Of course, the anti-reflective layer 53' may include other types of materials.

Additionally, each anti-reflective layer 53' may have a permeability that is within about ±10% of the permittivity. This may advantageously allows light to pass through regardless of color or wavelength.

As will be appreciated by those skilled in the art, light passing through the patch antenna 40', the dielectric layer 52', and the antenna ground plane 51' to the photovoltaic layer 60' is converted to electrical energy. The converted electrical energy from the photovoltaic layer 60' may be used to power the wireless circuitry 34', for example.

A prior art ground plane antenna, for example, is typically a solid square of metallic material with radiating elements over a ground plane. Thus, light cannot pass through, which may make it increasingly difficult to combine the functionality of a photovoltaic layer with a patch antenna to achieve desired antenna characteristics.

Indeed, combination of a patch antenna and photovoltaic layer, including, for example, a solar cell may be particularly advantageous in satellite communications. More particularly, a combined antenna and photovoltaic layer device may reduce surface area of a satellite, and thus launch costs. For example, year 2000 launch costs were about $11,729.00 per pound. A solar cell, which is mostly silicon, weighs about 5803 pounds per cubic meter, and are about 0.002 meters thick. Thus, a solar cell weighs about 15 pounds per square meter, thus giving a launch cost of $176,000.00 per square meter for solar cells. Thus, any reduction is overall weight advantageously translates into a reduced cost.

Figure 6:
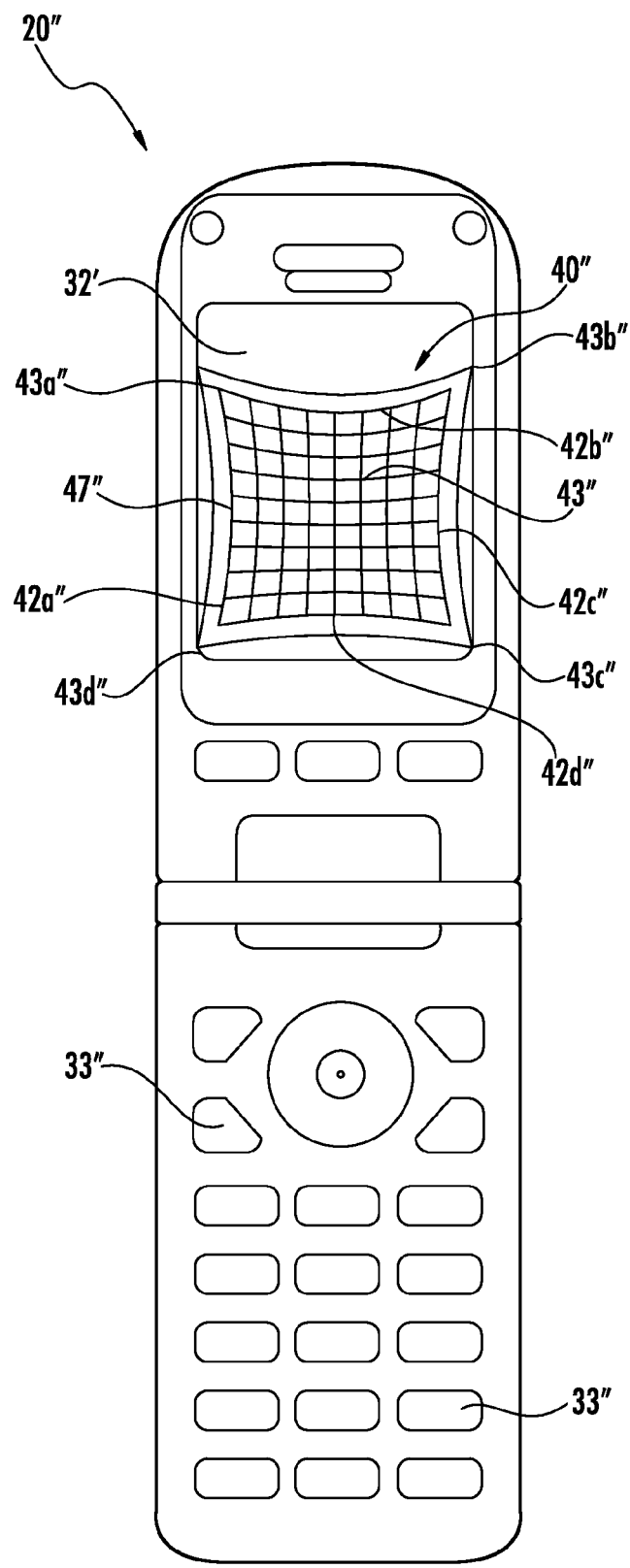
FIG. 6 is a top view of another embodiment of an electronic device in accordance with the present invention.
Figure 7:
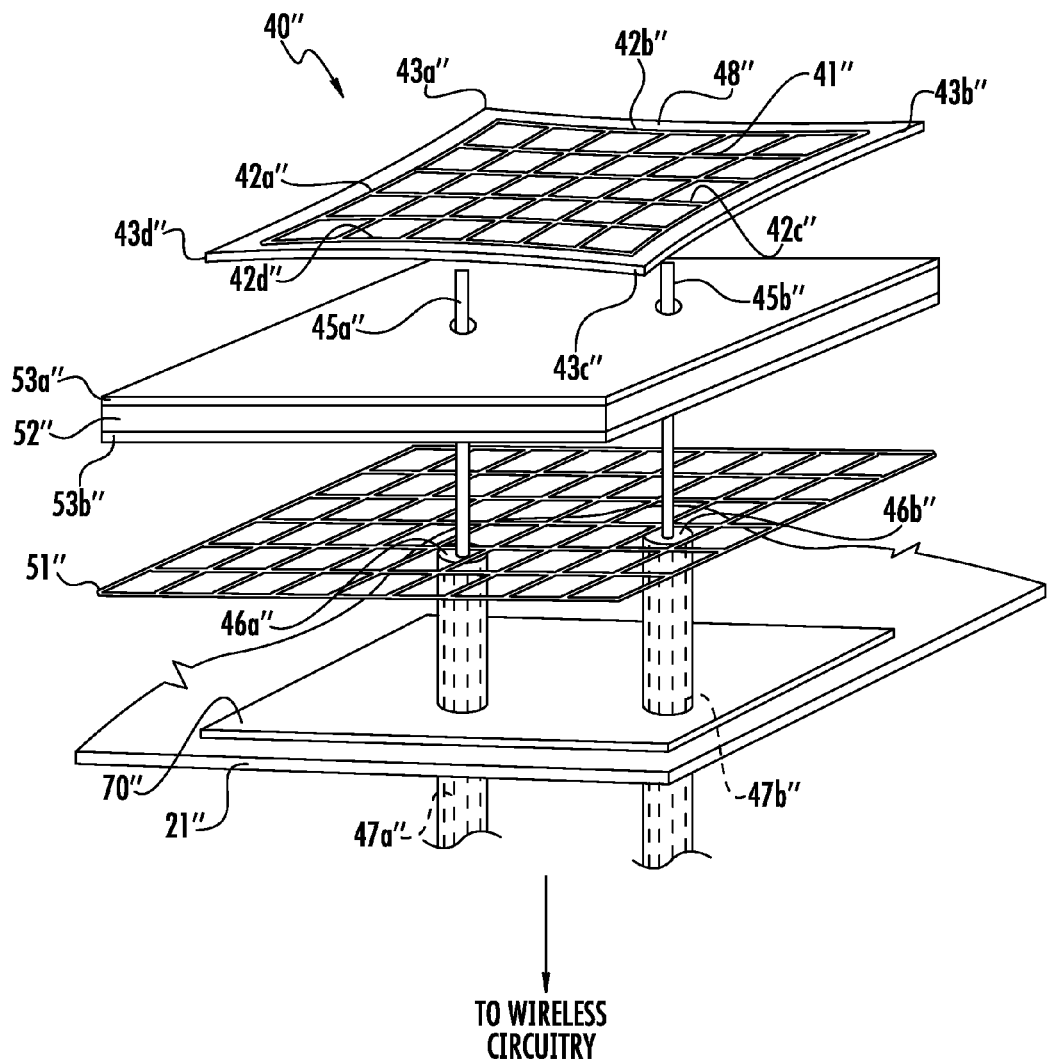
FIG. 7 is a perspective exploded view of a portion of the electronic device in FIG. 6.

Referring now to FIGS. 6-7, another particularly advantageous embodiment of the patch is illustrated in an electronic device 20". The electronic device 20" is illustratively a mobile wireless communications device and includes input devices 33" or keys and a display 32" carried by the housing 31". The electronic device 20" includes a substrate 21" and a stacked arrangement of layers (FIG. 7). A visual display layer 70" is above the substrate 21'. The visual display layer 70" is illustratively a liquid crystal display (LCD). The visual display layer 70" may be another type of light emitting or light modulating visual display, as will be appreciated by those skilled in the art.

The antenna ground plane 51" is illustratively above the visual display layer 70" and between the substrate 21" and the patch antenna 40". The antenna ground plane 51" is illustratively also as a mesh so that it is optically transmissive to allow the visual display layer 70" to be seen therethrough. In some embodiments, the antenna ground plane 51" may be omitted, as the visual display layer 70" may include or be sufficient as the ground plane.

The patch antenna 40" is illustratively above the visual display layer 70" and the antenna ground plane 51". The patch antenna 40" is illustratively a conductive mesh material or includes a conductive mesh layer 41" that is also optically transmissive.

The dielectric layer 52" between the antenna ground plane 51" and the patch antenna 40" is also light-transmissive. The dielectric layer 52" may be plastic, for example, and may be part of the housing 31" of the wireless communications device 20". More particularly, the dielectric layer 52" may be the clear plastic layer of a wireless communications device housing 31" that typically covers the visual display layer 70", or LCD.

The dielectric layer 52" may also include an anti-reflective layer 53a", 53b" on both sides thereof to reduce light reflection back away from the visual display layer 70". Of course, the anti-reflective layer 53" may be on one side of the dielectric layer 52" and may be on a portion or portions of the dielectric layer.

As will be appreciated by those skilled in the art, light passing through the patch antenna 40", the dielectric layer 52", and the antenna ground plane 51" from the visual display layer 70" advantageously allows a user to see the visual display layer, while including the functionality of the patch antenna. Thus, the overall size increase of the electronic device for the stacked arrangement of layers is relatively small.

Referring now to the graphs 71, 72, 73, 74, 75 in FIGS. 8-11, a prototype electronic device was formed and included the patch antenna having an electrically conductive and optically transmissive mesh antenna patch layer, the optically transmissive dielectric layer, and the optically transmissive antenna ground plane also having an electrically conductive mesh layer. The prototype electronic device has the parameters, for example, size, listed below in Table 1.

TABLE 1

| Parameter | Specification | Basis |
|---|---|---|
| Size | 2.25" × 2.25" × 0.27" | Measured |
| Weight | 25 grams | Measured |
| Center Operating Frequency | 1575.42 MHz (GPS L1) | Specified |
| Realized Peak Gain Frequency | 1598 MHz | Measured |
| Realized Gain | 3.73 dBic | Simulated for |
| Realized Gain | −0.1 dBic | Measured |
| Half Power Beamwidth | 88 degrees | Simulated for |
| Radiation Pattern | Single petal rose, broadside to antenna plane | Simulated for |
| 3 dB Gain Bandwidth | 99 MHz | Simulated for |
| 3 dB Gain Bandwidth | 129 MHz | Measured |

TABLE 1-continued

| Parameter | Specification | Basis |
|---|---|---|
| Impedance | 50 ohms nominal | Specified |
| Polarization | Right hand circular | Specified |
| Polarization Axial Ratio | <0.3 dB | Measured |
| Beam Forming Network | 0, 90 degree hybrid divider | Implemented |
| Antenna Patch Material | Brass screen of fine wire | Implemented |
| Reflector Material | Gold - Molybdenum fabric | Implemented |
| Substrate | Lexan ™ Polycarbonate | Implemented |
| Substrate Relative Dielectric Constant (RF) | 2.94 dimensionless | Handbook |
| Substrate Optical Transmission | 88% | Handbook |
| Total Light Transmission Through The Antenna, normal incidence | 52% | Measured |
| Current Distribution | Traveling Wave or nearly so | Simulated for |

It should be noted that simulated data in Table 1 assumed perfect loss-less materials, while the measured data was taken from a physical prototype having materials with heat losses. With respect to the differences between the measured and simulated losses for the prototype, the losses from the polycarbonate, i.e. optically transmissive dielectric layer, may be attributed to the polycarbonate not being vended as a microwave printed wire board, or dielectric, material. The polycarbonate actual loss tangent was higher than listed in the table. Replacement of the polycarbonate with a polystyrene material may increase performance by reducing losses. A polycarbonate substrate was used for its high impact resistance and was relatively efficient enough to permit GPS reception.

Additionally, the coaxial cable and power divider was not simulated. With respect to the ground plane layer, which was a brass mesh or screen, the measured results include contact resistances, directional bias, and mechanical tolerances, which were not captured by simulation.

Figure 8:
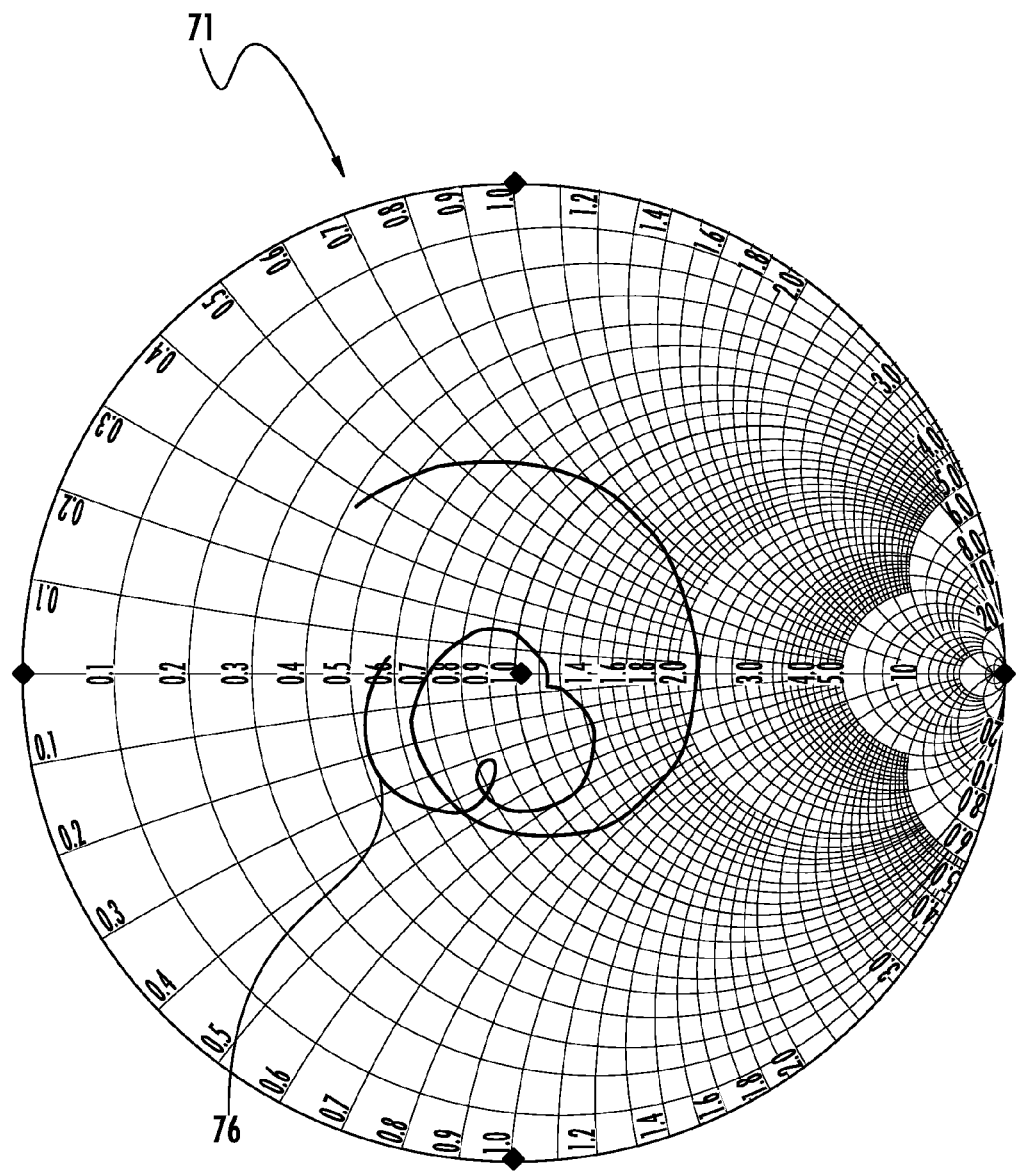
FIG. 8 is a graph of measured impedance of a prototype electronic device in accordance with the present invention.
Figure 9:
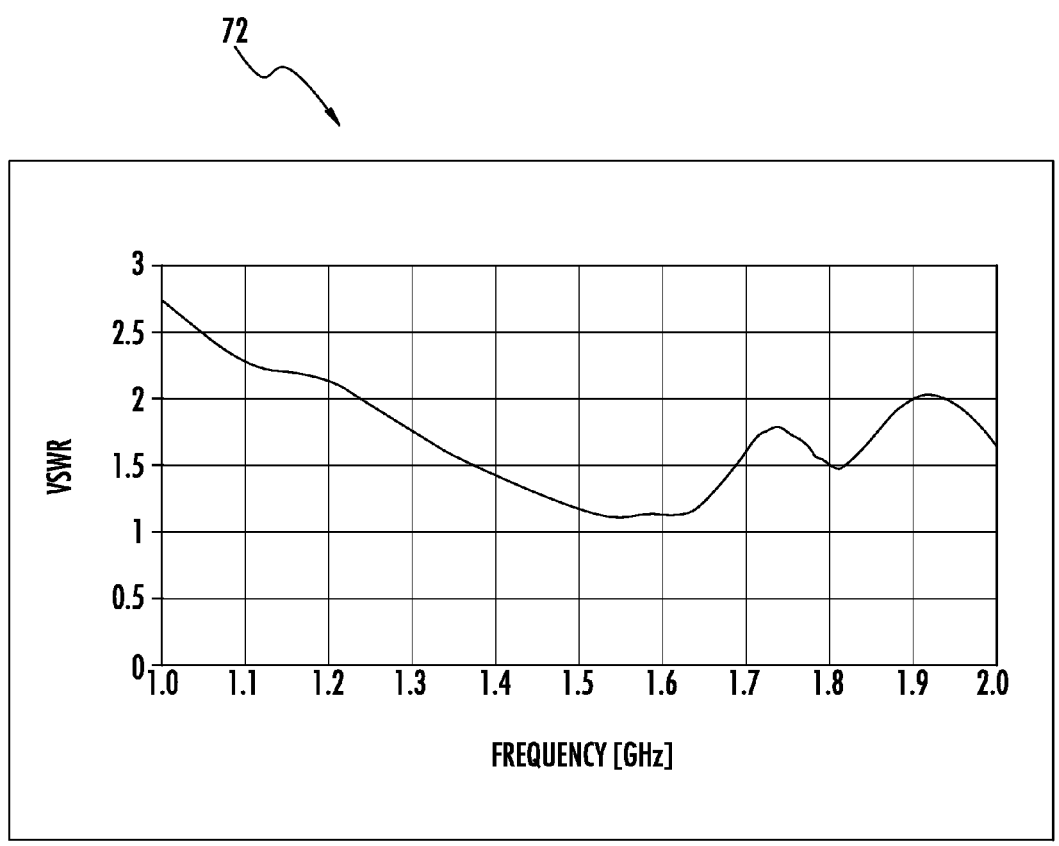
FIG. 9 is a graph of measured voltage standing wave ratio of the prototype electronic device.
Figure 10:
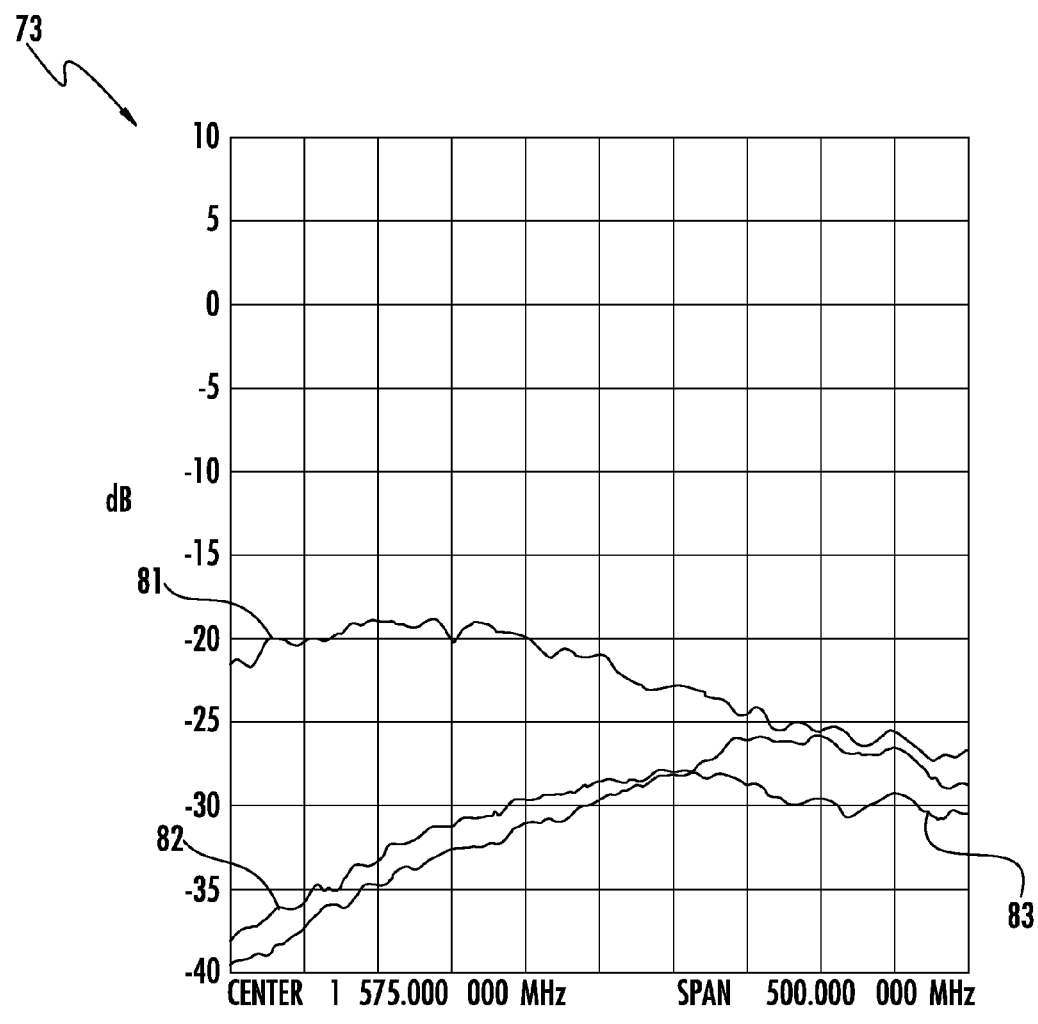
FIG. 10 is a graph of measured gain of the prototype electronic device.

Referring particularly to the Smith Chart 71 in FIG. 8, the two curls of the impedance response 76 indicate that the patch antenna has a double tuned Chebyschev polynomial behavior. A Chebyschev behavior is relatively good for bandwidth, as it is about four-time that of a quadratic and/or single tuned response, for example.

The realized gain of the physical prototype was measured on an antenna range. Referring now to the graph 73 in FIG. 10, the measured realized gain response over frequency is illustrated. This may be referred to as a swept gain measurement. The data was taken at the look angle of radiation pattern peak amplitude, which was broadside or normal to the antenna physical plane. The method used was the gain comparison method or substitution method, and a thin wire half wave dipole was used as the gain standard which is known to have a gain of 2.1 dBil.

The reference dipole gain is illustrated by line 81, and the realized gain at each of the antenna feeds is illustrated by lines 82 and 83. There were two antenna feed ports on the hybrid: one providing right hand circular polarization and the other left hand circular polarization. The prototype reception was 5.2 dB down from the half wave dipole. Applying the Substitution Method: Measured Patch Antenna Gain=Reference Dipole Gain+Polarization Loss Factor+The Difference In Transmission Loss=2.1+3.0+(−5.2)=−0.1 dBic.

The polarization loss factor arises from the fact that the source dipole was linearly polarized, and the antenna under test was circularly polarized. The polarization loss factor for a linearly polarized antenna receiving circular polarization is 3 dB. The measured realized gain includes the loss mechanisms that accompany real world antennas, such as, for example, materials heating and VSWR. Where lines 82, 83 overlap the polarization of the prototype was substantially or nearly perfectly circular so near perfect circular polarization was realized near 1610 MHz.

Figure 11:
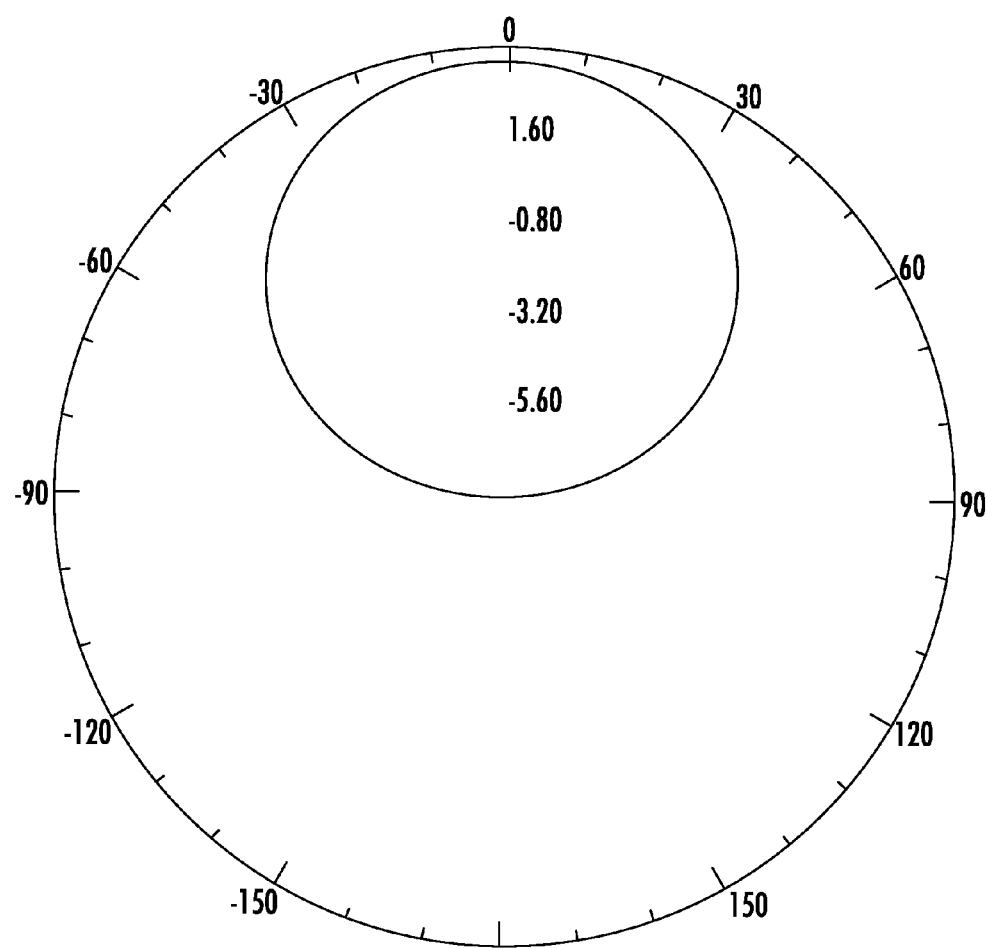
FIG. 11 is a graph of a calculated radiation pattern of the prototype electronic device.

The graph 74 in FIG. 11 is an elevation plane radiation pattern cut obtained by numerical electromagnetic simulation, and it illustrates that the half power beamwidth is 88 degrees. The radiation pattern lobe is broadside, e.g. the beam is normal to plane that the antenna lies in and there is a radiation pattern minima in the antenna plane. FIG. 8 was calculated using an infinite ground plane so there are no side lobes or backlobes in the plot.

Another prototype electronic device was formed and further included the photovoltaic layer. The prototype electronic device was tested for DC power production. The photovoltaic layer included a series wired string of six model XOB 17-12 XI Solar Cells as manufactured by IXYS Corporation of Milpitas, Calif. Standing alone, the solar cell string provided 2.9 volts at 362 milliamperes in relatively bright sunlight. When included as part of the prototype electronic device, the measured current output was 18.4 milliamperes at nearly the same voltage. Thus, 50 percent of the un-shaded power output was obtained. As will be appreciated by those skilled in the art, the patch antenna provided a beneficial trade of wireless transmission and reception while permitting useful solar power production from the same surface area, and increased levels of DC power output may be obtained. While an optical coating was not used in the prototype electronic device, it may be used in conjunction with any of the layers. Additionally, a relatively finer conductive mesh may also be used.

During the solar power testing no photosensitivity of the patch antenna was noted. In other words, neither the solar cells nor sunlight affected the tuning of the patch antenna.

A method aspect is directed to a method of making an electronic device 20. The method includes forming a patch antenna 40 to be carried by a substrate 21 and to include an electrically conductive mesh 41 layer having a perimeter defined by a plurality of perimeter segments comprising two pair of arcuate perimeter 42a-42d segments with a cusp therebetween 43a-43d. The method also includes coupling at least one antenna feed 44 to the patch antenna.

Another method aspect is directed to a method of making an electronic device 20'. The method includes forming a stacked arrangement of layers on a substrate 21' by at least positioning a photovoltaic layer 60' above the substrate 21', and positioning an antenna ground plane 51' above the photovoltaic layer 60'. The antenna ground plane 51' includes a first electrically conductive mesh layer being optically transmissive. Forming the stacked arrangement also includes positioning a patch antenna 40' above the photovoltaic layer 60' that includes a second electrically conductive mesh layer being optically transmissive.

Yet another method aspect is directed to a method of making an electronic device 20". The method includes forming a stacked arrangement of layers on a substrate 21" by at least positioning a patch antenna 40" above a visual display layer 70". The patch antenna 40" includes an electrically conductive mesh that is optically transmissive.

Further details of electronic devices including a patch antenna may be found in co-pending applications GCSD-2373, and GCSD-2380, which are assigned to the assignee of the present application, and the entire contents of all of which are herein incorporated by reference. Many modifications and other embodiments will come to the mind of one skilled in the art having the benefit of the teachings presented in the foregoing descriptions and the associated drawings. Therefore, it is understood that the disclosure is not to be limited to the specific embodiments disclosed, and that modifications and embodiments are intended to be included.

That which is claimed is:

1. An electronic device comprising:
  a substrate and a stacked arrangement of layers thereon comprising
    a photovoltaic layer above said substrate,
    an antenna ground plane above said photovoltaic layer and comprising a first electrically conductive optically transmissive mesh layer, and
    a patch antenna above said photovoltaic layer and comprising a second electrically conductive optically transmissive mesh layer.

2. The electronic device according to claim 1, further comprising an optically transmissive dielectric layer between said antenna ground plane and said patch antenna.

3. The electronic device according to claim 2, further comprising at least one anti-reflective layer on said optically transmissive dielectric layer.

4. The electronic device according to claim 1, wherein said patch antenna has a perimeter defined by a plurality of perimeter segments comprising at least one pair of arcuate perimeter segments with a cusp therebetween.

5. The electronic device according to claim 4, wherein said at least one pair of arcuate perimeter segments are inwardly extending.

6. The antenna assembly according to claim 1, wherein said patch antenna is planar.

7. The electronic device according to claim 1, further comprising at least one antenna feed coupled to said patch antenna.

8. The electronic device according to claim 7, said at least one antenna feed comprises a pair of antenna feeds operable to provide a non-linear polarization.

9. The electronic device according to claim 1, wherein said second electrically conductive optically transmissive mesh layer comprises a flexible interwoven electrically conductive mesh layer.

10. The electronic device according to claim 1, wherein said second electrically conductive optically transmissive mesh layer comprises a body portion and a hem portion coupled thereto.

11. An electronic device comprising:
  a substrate and a stacked arrangement of layers thereon comprising
    a photovoltaic layer above said substrate,
    an antenna ground plane above said photovoltaic layer and comprising a first electrically conductive optically transmissive mesh layer,
    a patch antenna above said photovoltaic layer and comprising a second electrically conductive optically transmissive mesh layer, and
    an optically transmissive dielectric layer between said antenna ground plane and said patch antenna; and
  wireless circuitry powered by said photovoltaic layer and coupled to said patch antenna.

12. The electronic device according to claim 11, further comprising at least one anti-reflective layer on said optically transmissive dielectric layer.

13. The electronic device according to claim 11, wherein said patch antenna has a perimeter defined by a plurality of perimeter segments comprising at least one pair of arcuate perimeter segments with a cusp therebetween.

14. The electronic device according to claim 13, wherein said at least one pair of arcuate perimeter segments are inwardly extending.

15. The electronic device according to claim 11, wherein said second electrically conductive optically transmissive mesh layer comprises a flexible interwoven electrically conductive optically transmissive mesh layer.

16. A method of making an electronic device comprising:
  forming a stacked arrangement of layers on a substrate by at least
    positioning a photovoltaic layer above the substrate,
    positioning an antenna ground plane above the photovoltaic layer and comprising a first electrically conductive optically transmissive mesh layer, and
    positioning a patch antenna above the photovoltaic layer and comprising a second electrically conductive optically transmissive mesh layer.

17. The method according to claim 16, wherein forming the stacked arrangement further comprises positioning an optically transmissive dielectric layer between the antenna ground plane and the patch antenna, the dielectric layer.

18. The method according to claim 17, wherein forming the stacked arrangement further comprises forming at least one anti-reflective layer on the optically transmissive dielectric layer.

19. The method according to claim 16, wherein the patch antenna has a perimeter defined by a plurality of perimeter segments comprising at least one pair of arcuate perimeter segments with a cusp therebetween.

20. The method according to claim 16, wherein the second electrically conductive optically transmissive mesh layer comprises a flexible interwoven electrically conductive optically transmissive mesh layer.

* * * * *